(12) United States Patent
Caruso et al.

(10) Patent No.: US 9,441,931 B1
(45) Date of Patent: Sep. 13, 2016

(54) MEMS ROTARY FUZE ARCHITECTURE FOR OUT-OF-LINE APPLICATIONS

(71) Applicant: Department of the Navy, Indian Head, MD (US)

(72) Inventors: Troy Caruso, Alexandria, VA (US); Thinh Hoang, Beltsville, MD (US); Daniel Jean, Odenton, MD (US); Kevin Cochran, Falls Church, VA (US); Andrew Jen, Alexandria, VA (US); Scott Rauscher, Washington, DC (US); Kristopher Nodianos, Strabane, PA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/756,652

(22) Filed: Sep. 29, 2015

(51) Int. Cl.
*F42C 15/188* (2006.01)
*F42C 15/40* (2006.01)
*F42C 19/12* (2006.01)
*B81B 3/00* (2006.01)
*B81C 1/00* (2006.01)

(52) U.S. Cl.
CPC ............. *F42C 19/12* (2013.01); *B81B 3/0024* (2013.01); *B81C 1/0019* (2013.01); *F42C 15/188* (2013.01); *B81B 2201/031* (2013.01); *B81B 2201/034* (2013.01); *B81C 1/00531* (2013.01)

(58) Field of Classification Search
CPC ...... F42C 15/18; F42C 15/188; F42C 15/40; F42C 19/12
USPC .............................................. 102/202.5, 221
See application file for complete search history.

(56) References Cited

U.S. PATENT DOCUMENTS

| | | |
|---|---|---|
| 7,591,225 B1 | 9/2009 | Cope et al. |
| 8,191,477 B1 | 6/2012 | Roesler |
| 2010/0308690 A1 | 12/2010 | Currano et al. |
| 2013/0008334 A1 | 1/2013 | Claridge et al. |

OTHER PUBLICATIONS

Randall D. Cope, "NAVAIR Fuze Overveiw" Charlotte, NC.
Randall D. Cope, NDIA's 55th Annual Fuze Conference, Navy Overview, NAVAIR China Lake.
Dale Spencer, teaches MEMS S & A Out-of-Line "Safe" Configuration and In-Line "armed" Configuration.

*Primary Examiner* — Reginald Tillman, Jr.
(74) *Attorney, Agent, or Firm* — Fredric Zimmerman

(57) ABSTRACT

An apparatus used in a fuze device, which includes a MEMS micro-rotor. The micro-rotor of the apparatus may move an explosive material, for example, a fuze material, from an out-of-line position to an in-line position. The micro-rotor includes an integral cavity in which the material may be safely loaded and held in the out-of-line position. At an appropriate time, the fuze device of a fully assembled ordnance may be armed. When the apparatus is activated, the micro-rotor carefully moves the explosive material to the in-line position, where the ordnance is armed.

14 Claims, 5 Drawing Sheets

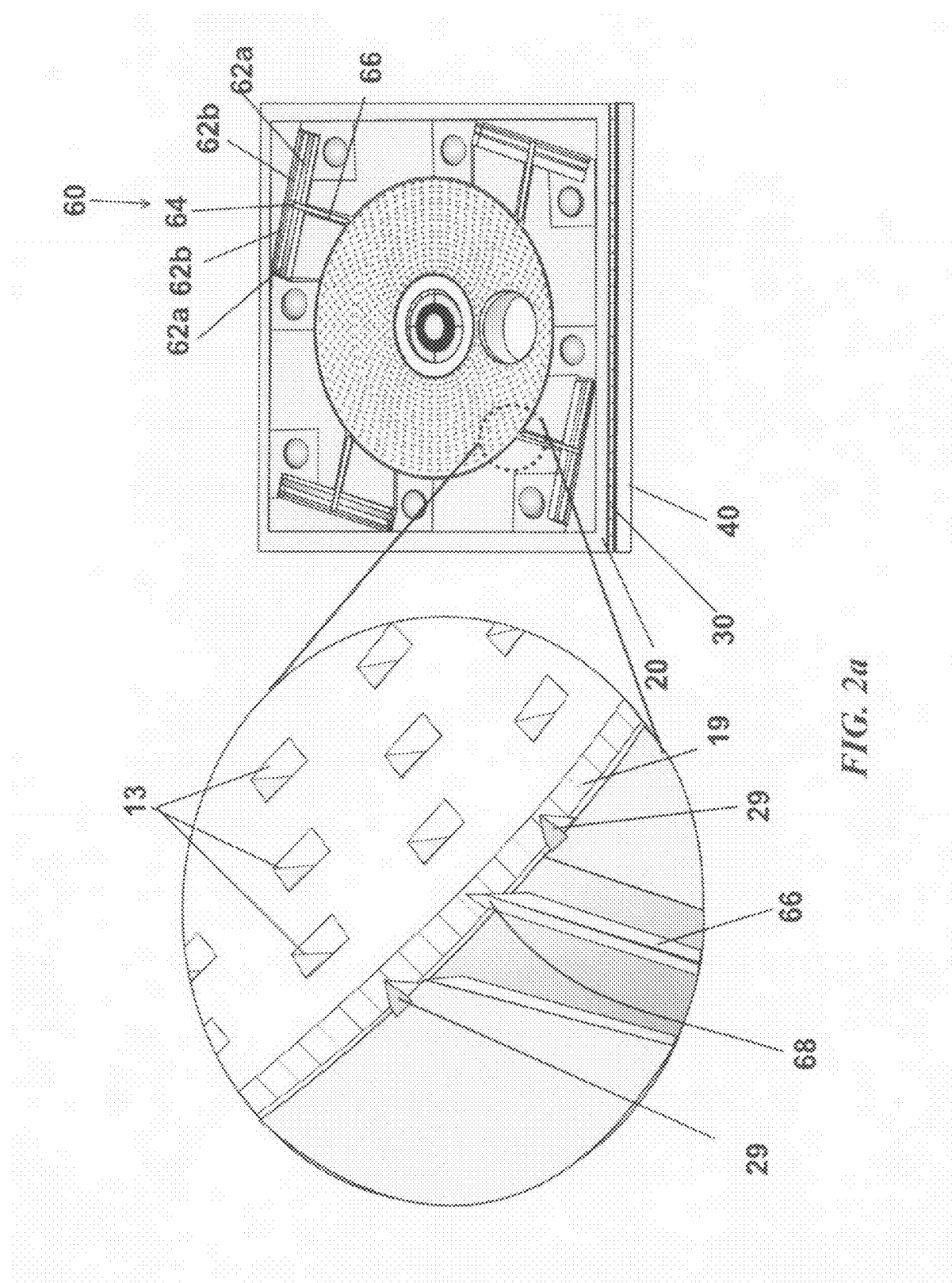

MEMS ROTARY FUZE ARCHITECTURE FOR OUT-OF-LINE APPLICATIONS

STATEMENT OF GOVERNMENT INTEREST

The invention described herein may be manufactured and used by or for the Government of the United States of America for Governmental purposes without the payment of any royalties thereon or therefore.

BACKGROUND OF THE INVENTION

1. Field of the Invention

The invention relates generally to fuzes and more particularly to a MEMS fuze that utilizes a plurality of thermal V-beam actuators to control a micro-rotor to move an explosive material from an out-of-line position to an in-line position.

2. Background

MEMS is an initialism for microelectromechanical system, and the abbreviation will be used throughout hereto forth. Fuze systems serve to detonate the main charge ('secondary' of military ordinance) of munitions, cartridges, and shells (collectively referred to herein as ordnance) at a desired time or location. The fuze plays an essential safety role in preventing accidental detonation of the ordnance, and it is instrumental in making the ordinance safe to handle. There are a variety of technologies used in fuze systems. For examples, some fuze systems are armed immediately prior to the ordnance being fired, and other systems are timed so that the fuze initiates detonation of the secondary charge of the ordnance at a desired time and/or location. One common approach to a fuse system is to charge a capacitor, and then discharge it at the desired time across a thin wire to create sufficient local heating or a spark to ignite the pinner-edgeary explosive, which subsequently ignites the main charge. On-board electronics or mechanical devices control the timing of the electrical discharge. Fuzes typically incorporate "g-switches" that prevent detonation until the fuze has been exposed to accelerations of a magnitude and time typically only encountered when fired while in a gun barrel. In other systems, a pinner-edgeary explosive such as silver azide is used to ignite the secondary explosive, where there are multiple safe guards to prevent accidental ignition of the secondary explosive even if the pinner-edgeary explosive ignites. An example, bombs and missiles carried by planes are not fitted onto the ordnance until just before the planes take off, thus preventing accidental ignition of the explosive firetrain. A system that utilized a secondary explosive as an igniter where secondary explosive are classified as less sensitive than pinner-edgeary explosives would be an even safer system. An example of a secondary explosive is EDF-11. It has been found that EDF-11 may be deposited as a slurry mix and, after drying, will perform as a secondary explosive. A secondary explosive may be ignited if subjected to a sufficient electrical spark or shock.

SUMMARY OF THE INVENTION

The disclosed invention is an apparatus for a fuze device where an apparatus has a MEMS micro-rotor, which can move an explosive material, where the explosive material is a fuze material. In operation, the MEMS micro-rotor moves the explosive material from an out-of-line position to an in-line position. The micro-rotor includes an integral cavity in which the material may be safely loaded and held in the out-of-line position indefinitely. At an appropriate time, the fuze device in fully assembled ordnance may be armed without physically adding the fuze device. The micro-rotor of the apparatus is actuated, and it securely and reliably moves the explosive material from the out-of-line position to the in-line position, where the ordnance is armed.

As will become apparent, the invented apparatus has a MEMS architecture immune to inertial effects in any direction. It is capable of higher speed translation, and has a smaller footprint. The smaller footprint allows for more fuze devices to be fabricated per wafer run, which is the most direct measure of cost per fuze device.

An aspect of the invention is that the micro-rotor is a superior alternative to using a traditional spring-mass system to translate, linearly, the explosive material loaded into the integral cavity to a channel cavity. Further, the explosive material is in-line with the firetrain, in large part, as the apparatus is based on a MEMS architecture, which is broadly a silicon based micro machine. The micro machine has excellent aging characteristics even in a salt water environment.

Another aspect of the invention is that the apparatus may largely be fabricated using processing methods that are used to make other MEMS based devices. A starting fabrication material is a multilayer wafer that includes a silicon device layer, a silicon supporting layer and an intervening insulator. The insulator may be etched away without damaging the device layer or the supporting layer. A plurality of the invented apparatus may be replicated utilizing the wafer, and then dicing the replications into multiple identical chips of the apparatus.

BRIEF DESCRIPTION OF THE DRAWINGS

The foregoing invention will become readily apparent by referring to the following detailed description and the appended drawings in which:

FIG. 2*a* is an exploded view illustrating the actuation mechanism that caused the micro-rotor to rotate from three o'clock to six o'clock.

DETAILED DESCRIPTION OF THE INVENTION

The invented rotary apparatus is fabricated using MEMS technology, which enables very small machines and electrical circuits to be formed. As an order of magnitude, a starting material is a silicon oxide insulator (SOI) wafer that has a silicon device layer, an insulator layer, and a silicon supporting layer. In the illustrated exemplary embodiment, the silicon device layer is about 100+/−50 microns thick, the insulator layer is about 4+/−3 microns thick, and the silicon supporting layer is about 500+/−200 microns thick.

Figure 1:
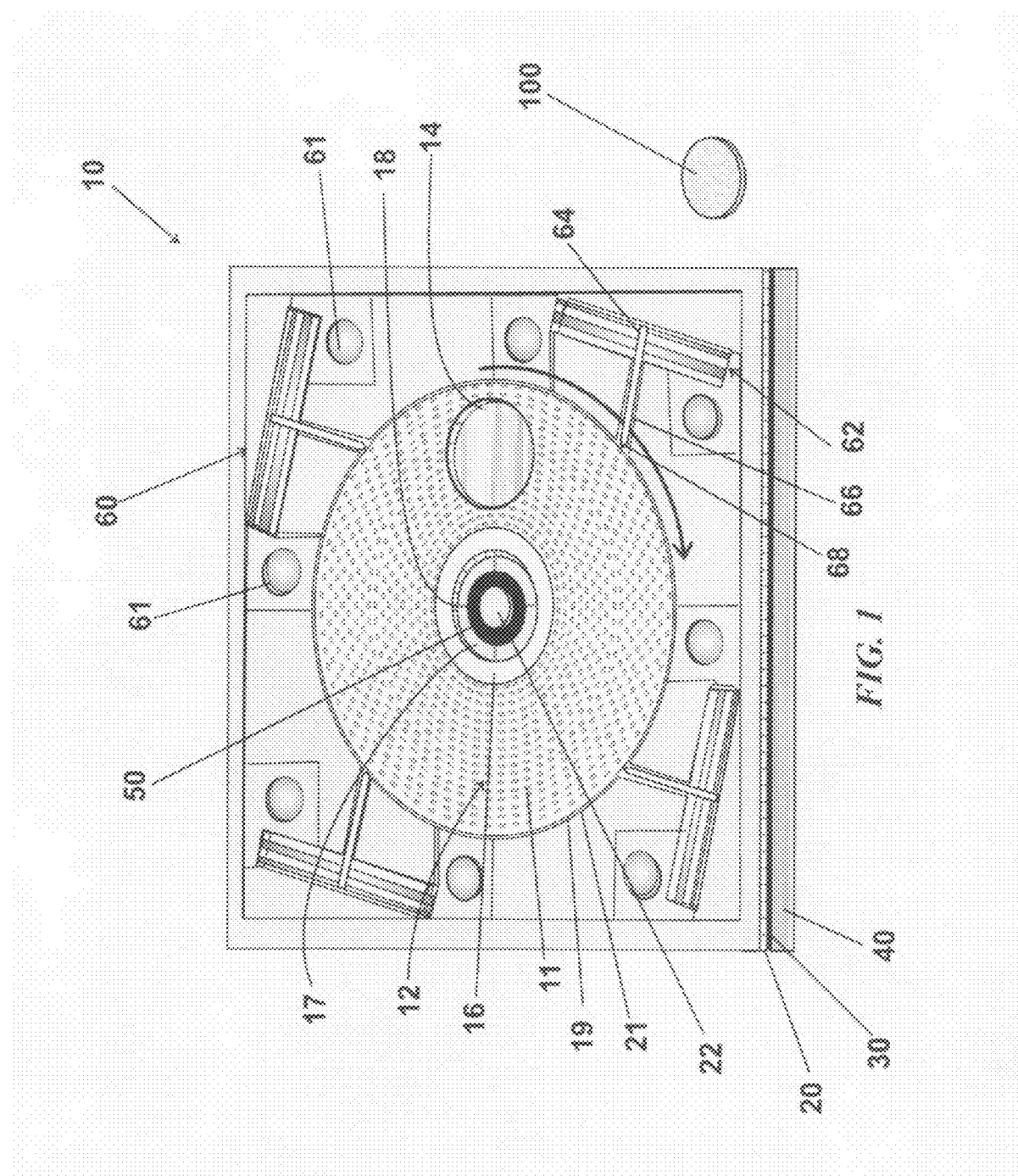
FIG. 1 is an elevated view of the apparatus wherein the micro-rotor is in the start position, the integral cavity (without any explosive material) is located at three o'clock, and there are four thermal actuators, which by default when there is no current, restrain movement of the micro-rotor.
Figure 2:
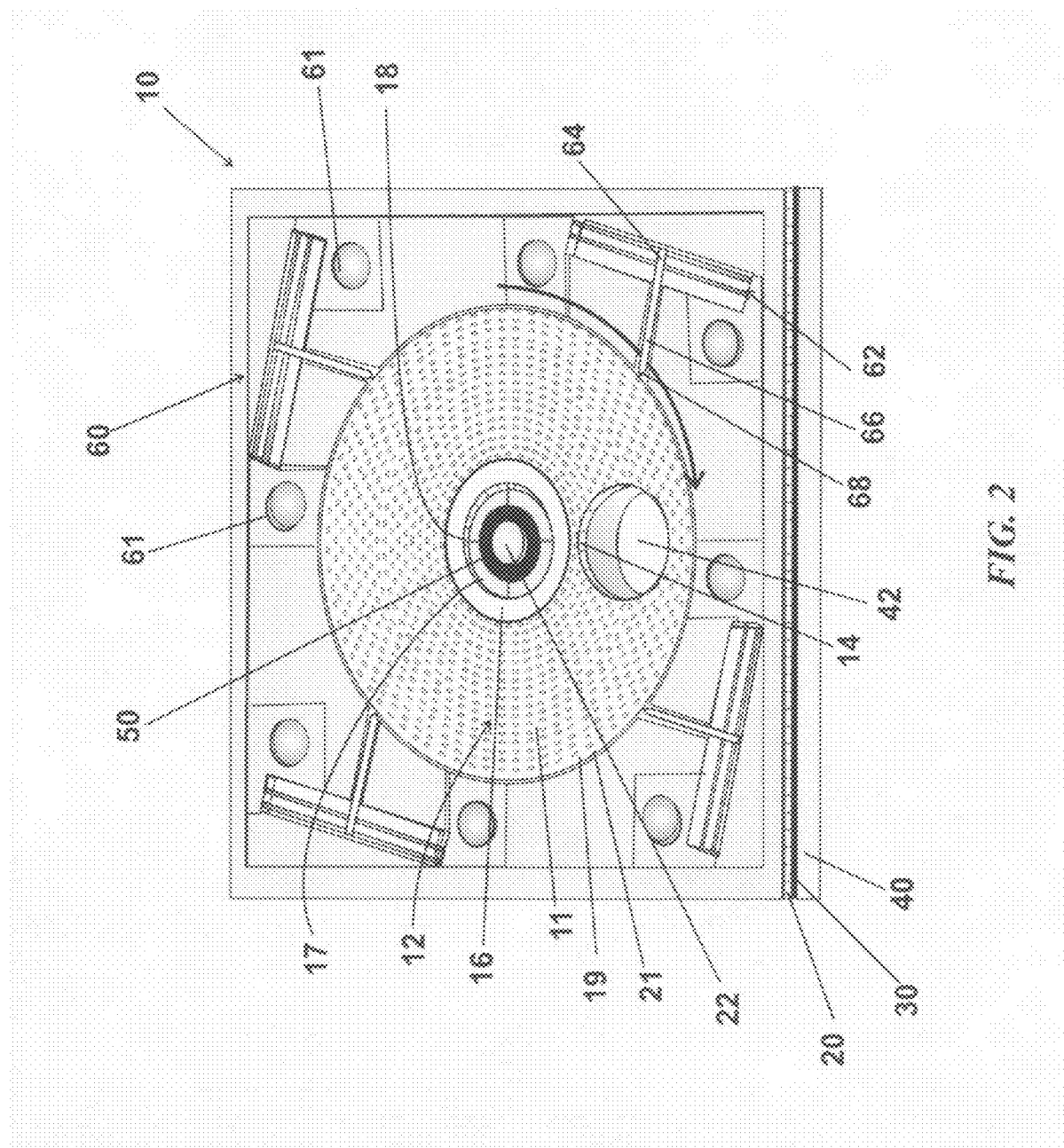
FIG. 2 is an elevated perspective view of the apparatus shown in FIG. 1, where the micro-rotor has rotated approximately 90 degrees, and the integral cavity has been moved and it is now located at six o'clock (in-line), where it is aligned with the through-layer channel cavity etched in the silicon supporting layer.
Figure 3:
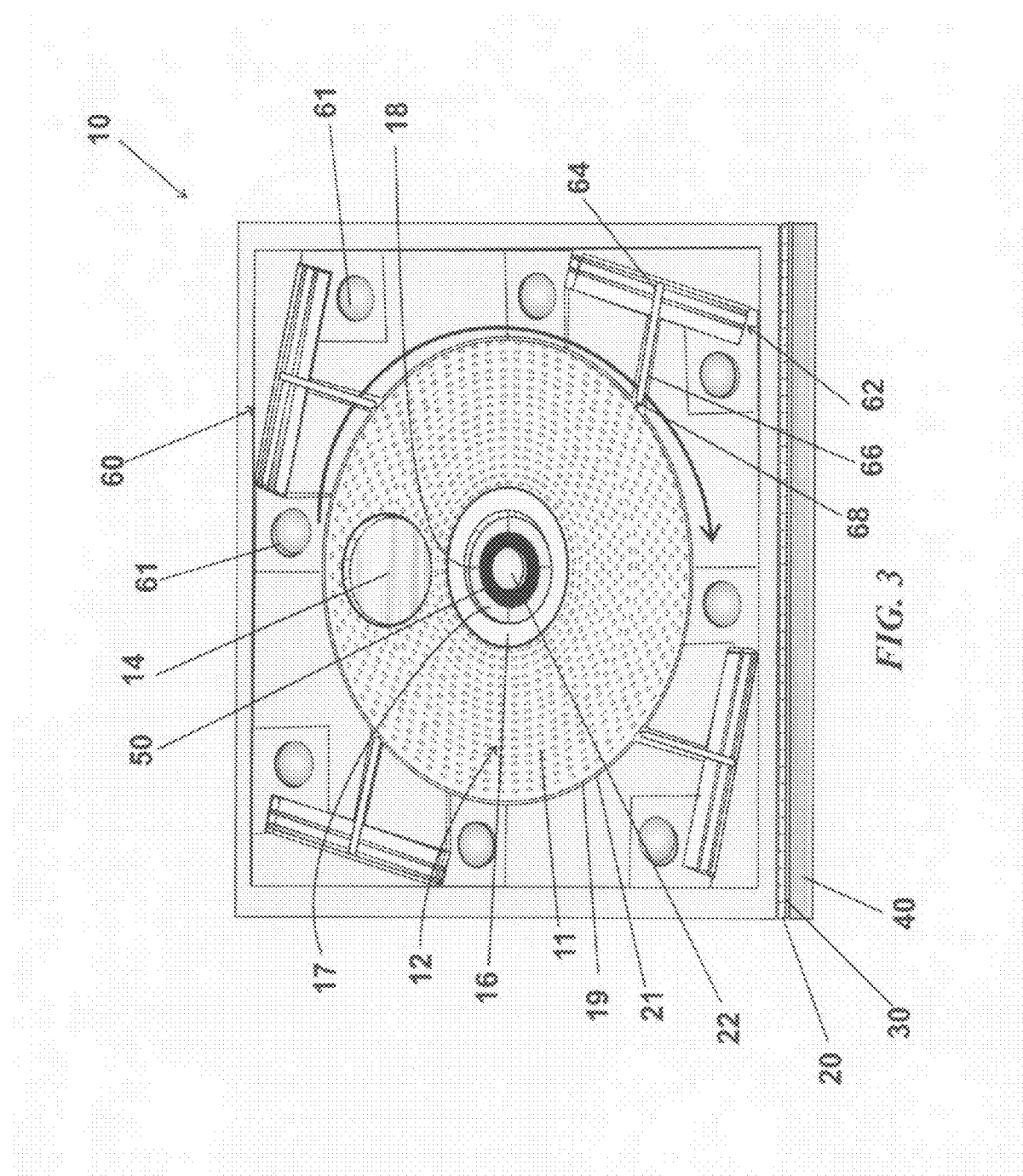
FIG. 3 is a diagrammatic elevated view illustrating an 180 degree arc of rotation from about twelve o'clock to six o'clock.

The embodied apparatus 10 is illustrated in FIG. 1. The silicon device layer 20, the insulator layer 30, and the silicon supporting layer 40 are visible from this elevated perspective view. The apparatus 10 enables small quantities of material, for example an explosive material 100 which has the potential as a fuze material (EDF-11), to be loaded in a micro-rotor 12 having an integral cavity 14, and moved to an armed position that is in-line with the firetrain. In the illustration, the starting position of the integral cavity 14 is at about three o'clock and the in-line armed position is at about six o'clock, as shown in FIG. 2. The about three o'clock position is out-of-line from an underlying through-layer channel cavity 42 located in the silicon supporting layer 40. At three o'clock, the integral cavity 14 is only 90 degrees from an in-line position. In FIG. 3, the starting position is at twelve o'clock, which is 180 degrees from the in-line position. So long as the integral cavity 14 is out-of-line from the underlying through-layer channel cavity 42 of the silicon supporting layer 40, the fuze is in a safe state, as the explosive cannot move into the through-layer channel cavity 42.

The micro-rotor 12 is a perforated disc 11 including an non-perorated center inner-edge portion 16 with an open center 17, at least one hub spoke 18, a perimeter edge 19 and the integral cavity 14, which is inboard of the perimeter edge 19

The integral cavity 14 is sized to be sufficiently large to retain the explosive material 100, for example EDF-11. The perforations 13, as shown in FIG. 2a, are a by-product of fabrication to remove the insulator layer 30 from beneath the disc 11.

The apparatus 10 include a stationary element, which is a central axial stator 22 that provides an axle point. The apparatus also includes a spring element 50 connecting the stationary central axial stator 22 to the hub spokes 18 of the micro-rotor 12. The spring element 50 provides elevational support for the micro-rotor 12, so that micro-rotor does rub against the silicon supporting layer 30 when rotating.

There is a plurality of thermal V-beam actuators 60 in the silicon device layer 20. As shown in the current embodiment, there are four actuators 60, where each actuator 60 has a pair of electrical contact pads 62. The thermal V-beam actuators 60 are equidistantly positioned outboard the perimeter edge 19 of the micro-rotor 12. They are electrically actuated by a current at a rate that is in-part dependent on a frequency of the current. Actuation produces a frictional force and a tangential force against the perimeter edge 19 of the micro-rotor causing the micro-rotor and the integral cavity 14 carrying the explosive material toward the channel cavity 42, which is the armed position. The rotation also winds and tensions the spring element 50, which is a coiled spring.

The thermal V-beam actuators 60 shown in the figures produce high force and are highly reliability. As shown in FIG. 2a, when a current is passed through the legs 62 of the actuator 60 there is thermal expansion and consequently a lateral motion of a center shuttle 64 that is attached to a V-beam 66. The V-beam motion has a tangential vectorial component, and a tip end 68 of the V-beam impinges the perimeter edge of the micro-rotor. The tangential vectorial component is equal or greater than 30 degrees from perpendicular. As the V-beam pushes against the perimeter edge 19, it causes the micro-rotor to rotate.

In addition to the actuators 60, the micro-rotor 12 may be frictionally held in position by tab tip elements 29, as shown in FIG. 2a. The tap tip elements 29 are formed in the silicon device layer 20, which are in close proximity to the perimeter edge 19.

Thermal actuators 60 are based on strain relief of constrained thermal expansion. When a current is passed through the legs 62 of the actuator 60, the legs closest to the micro-rotor 62a do not expand as much as the adjoining parallel legs 62b. The anisotropic expansion results in the strain relieving motion causing the center shuttle 64 to shift toward the micro-rotor. When the current is lowered, the warmer legs 62b cool, and the shuttle moves away from the micro-rotor. Thermal actuators come in multiple variations but all rely on anisotropic expansion. A unique property of the illustrated thermal actuator is that movement of the center shuttle 64 is linear. The iterative action of the thermal actuators 60 cause the micro-rotor to rotate.

Figure 4:
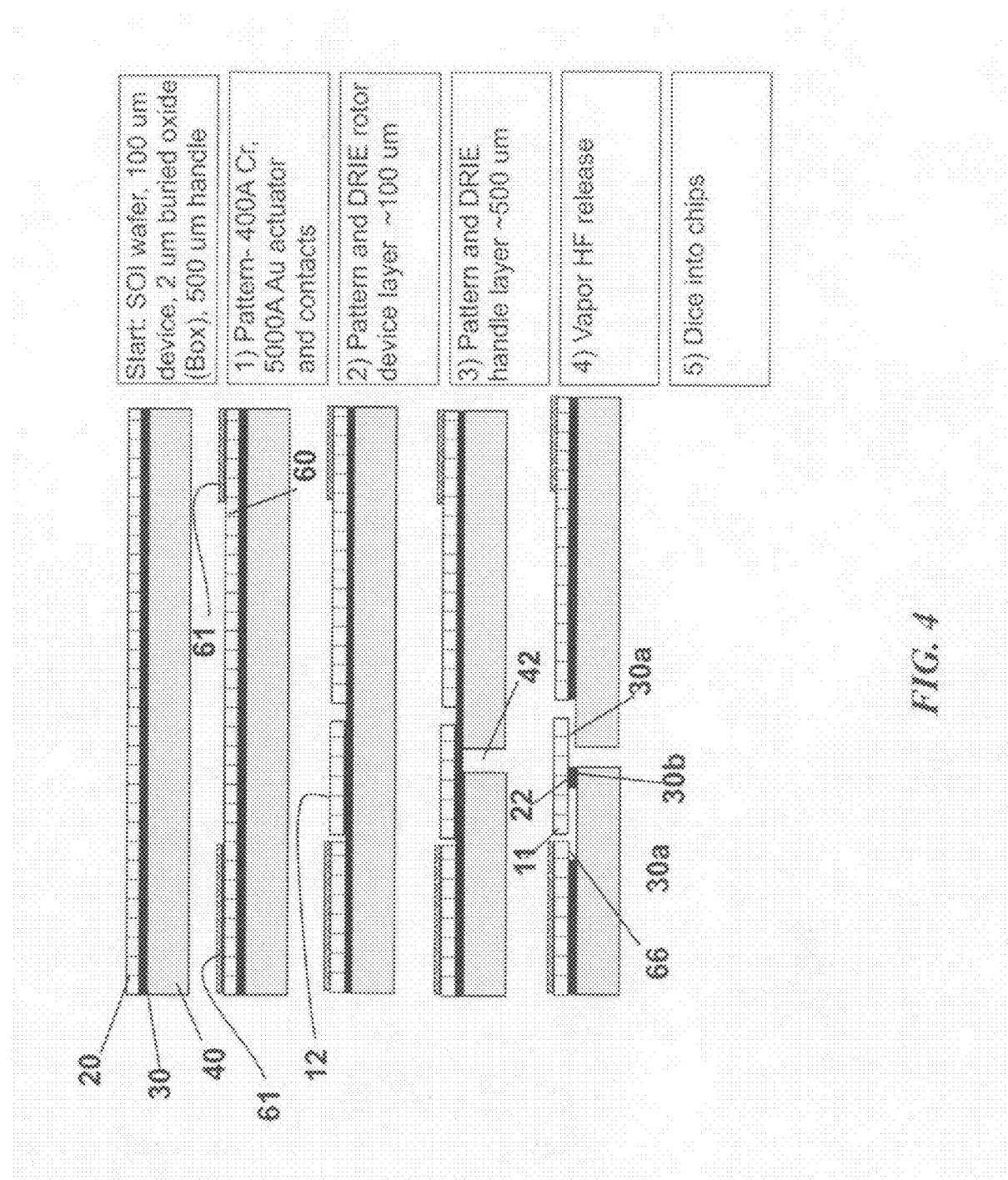
FIG. 4 is a diagrammatic view illustrating the MEMS Fabrication process flow diagram for a wafer for at least one apparatus, where the process employs Deep Reactive-Ion Etching (DRIE).

FIG. 4 diagrammatically illustrates the MEMS Fabrication process flow diagram for a wafer for at least one apparatus. The process employs Deep Reactive-Ion Etching (DRIE). As shown the SIO wafer includes a silicon device layer 20, a insulator layer 30, and a silicon supporting (aka handle) layer. In one step the gold (Au) terminal pads 61 for the thermal actuators 60 are deposited on the silicon device layer 20. The pattern for the micro-rotor 12 and elements of an actuator 60 are etched into the silicon device layer 20. The channel cavity 42 is etched through the silicon support layer 40. In step 4, a portion of the insulator layer 30a underlying the perforated disc 11 is etched away using HF (hydrofluoric) vapor release. The pores 13 (FIG. 2a) improve access and therefore the efficiency of etching. The stator 22 is left attached to the insulating layer 30b and the silicone support layer (handle) 40. The HF etching provides freedom of movement for the V-beam 66 of an actuator. When the process of replicating the apparatus on the wafer, the wafer may be broken into one or more individual MEMS chip(s) of the apparatus.

The invented apparatus 10 may be included in a MEMS assemblage. The MEMS architecture is immune to inertial effects in any direction. It is capable of higher speed translation, and has a smaller footprint. The smaller footprint allows for more fuze devices to be fabricated per wafer run, which is the most direct measure of cost per fuze device.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A MEMS apparatus for a fuze device, comprising
   a silicon device layer comprising a micro-rotor being comprised of a perforated disc with an open center with a hub spoke, a perimeter edge and an integral cavity that is inboard the perimeter edge, where the integral cavity is sufficiently large to retain an explosive material needed for a fuze;
   a stationary element, where the stationary element is central axial stator that provides an axle point;
   a spring element connecting the micro-rotor to the stationary central axial stator, providing elevational support for the micro-rotor;
   a plurality of thermal actuators in said device layer, wherein the actuators are outboard the perimeter edge of the micro-rotor, and are electrically actuated by a current at a frequency, wherein actuation causes a V-beam to impinge, tangentially, the perimeter edge of the micro-rotor to cause the perforated disc to be rotated, where rotation winds and tensions the spring element as it rotates toward an armed position;

a safe position, wherein the safe position is an initial default position where the integral cavity of the micro-rotor is an out-of-line position, and the fuze device is not armed;

a silicon supporting layer being comprised of a through-layer channel cavity that is located at an angularly offset position from the safe position,
wherein, the integral cavity of the micro-rotor is rotatable to the angularly offset position where the integral cavity is aligned with through-layer channel cavity, wherein the MEMS apparatus is in-line and the fuze device is armed, and
wherein the silicon supporting layer is co-planar to the silicon device layer; and an insulator layer being situated between portions of the silicon device layer and the insulator layer,
wherein the insulator layer bonds the stationary element located in the silicon device layer to the silicon supporting layer.

2. The apparatus according to claim 1, wherein speed of rotation of the micro-rotor is at least one of slowed, stopped and even reversed, once the integral cavity is aligned with the through-layer channel cavity, and the explosive material cannot be moved back to the safe position.

3. The apparatus according to claim 1, wherein the spring element is a coiled spring, wherein when none of the thermal actuators apply a force against the perimeter edge of the micro-rotor, the coiled spring causes the micro-rotor to return to a position proximate to an originating position, and wherein the safe position and the through-layer channel cavity is covered by the disc.

4. The apparatus according to claim 1, further comprising a pair of contact pads being for each of the plurality of thermal actuators.

5. The apparatus according to claim 1, wherein the frequency of the current to the actuators operates in one of in-phase and out-of-phase and also operates t variable frequencies to create the desired micro-rotor response.

6. The apparatus according to claim 1, wherein the actuators are V-beam actuators, wherein a current passed through legs of the actuator causes an anisotropic thermal expansion and consequently a lateral motion of a center shuttle, and wherein the V-beam motion includes a tangential vectorial component and an end of the V-beam impinges the perimeter edge of the micro-rotor, to cause the micro-rotor to rotate.

7. The apparatus according to claim 6, wherein the tangential vectorial component is at least equal to 30 degrees from perpendicular.

8. The apparatus according to claim 1, wherein the actuators produce an in-plane high-force linear-motion.

9. The apparatus according to claim 1, wherein the silicon device layer has a thickness of about 100 to about-50 microns.

10. The apparatus according to claim 1, wherein the silicon support layer has a thickness of about 500 to about-200 microns.

11. The apparatus according to claim 1, wherein the insulator layer has a thickness of about 4 to about-3 microns.

12. A process for fabricating a MEMS micro-rotor apparatus, comprising:
providing a silicon oxide insulator (SOI) wafer including a silicon device layer, an insulator layer, and a silicon supporting layer;
drawing and masking a pattern for Deep Reactive-Ion Etching (DRIE);
depositing a pair of conductive terminal pads for each thermal actuator, wherein the conductive terminal pads are deposited on the silicon device layer;
DRIE etching a disc through the silicon device layer, wherein the disc includes a perimeter edge and an integral cavity that is inboard the perimeter edge;
DRIE etching a through-layer channel cavity in the silicon supporting layer,
wherein the through-layer channel cavity includes a cross-sectional shape that is at least comparable to a cross-sectional shape of the integral cavity, and
wherein the integral cavity is rotatable into alignment with the through-layer channel cavity;
perforating the disc;
using HF (hydrofluoric) vapor for removing a portion of the insulator layer under the perforated disc so that rotation is possible, while maintaining a portion of insulator layer under a stationary stator; and
providing freedom of movement for an actionable element of an etched thermal actuator.

13. The process according to claim 12, further comprising breaking the wafer into at least one individual MEMS chip of the apparatus.

14. The process according to claim 13, further comprising fitting the apparatus with a spring.

* * * * *